(12) United States Patent
Kim

(10) Patent No.: US 7,830,188 B2
(45) Date of Patent: Nov. 9, 2010

(54) SEMICONDUCTOR INTEGRATED CIRCUIT AND METHOD OF CONTROLLING THE SAME

(75) Inventor: Kyoung-Nam Kim, Ichon (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 12/333,173

(22) Filed: Dec. 11, 2008

(65) Prior Publication Data

US 2010/0033218 A1 Feb. 11, 2010

(30) Foreign Application Priority Data

Aug. 11, 2008 (KR) ...................... 10-2008-0078589

(51) Int. Cl.
*H03L 7/06* (2006.01)
(52) U.S. Cl. ...................... 327/158; 327/149
(58) Field of Classification Search ................. 327/149, 327/158
See application file for complete search history.

(56) References Cited

U.S. PATENT DOCUMENTS

| | | | | |
|---|---|---|---|---|
| 6,828,835 | B2 * | 12/2004 | Cho | 327/158 |
| 6,937,076 | B2 | 8/2005 | Gomm | |
| 7,026,859 | B2 * | 4/2006 | Yang et al. | 327/427 |
| 7,449,930 | B2 * | 11/2008 | Hur | 327/158 |
| 7,489,170 | B2 * | 2/2009 | Ku et al. | 327/158 |
| 7,545,189 | B2 * | 6/2009 | Ku | 327/158 |
| 7,652,939 | B2 * | 1/2010 | Kim et al. | 365/194 |
| 2005/0262373 | A1 * | 11/2005 | Kim | 713/401 |
| 2007/0069775 | A1 * | 3/2007 | Ku et al. | 327/158 |
| 2007/0069776 | A1 * | 3/2007 | Hur | 327/158 |
| 2008/0165607 | A1 * | 7/2008 | Kim et al. | 365/227 |
| 2009/0045858 | A1 * | 2/2009 | Hur | 327/158 |
| 2009/0256604 | A1 * | 10/2009 | Ku | 327/158 |
| 2009/0284290 | A1 * | 11/2009 | Kuroki et al. | 327/158 |
| 2010/0033218 | A1 * | 2/2010 | Kim | 327/158 |
| 2010/0033219 | A1 * | 2/2010 | Kim | 327/158 |

FOREIGN PATENT DOCUMENTS

| | | |
|---|---|---|
| KR | 1020030002131 | 1/2003 |
| KR | 1020040103035 | 12/2004 |
| KR | 1020070036564 | 4/2007 |
| KR | 1020070036641 | 4/2007 |

* cited by examiner

*Primary Examiner*—Lincoln Donovan
*Assistant Examiner*—Adam D Houston
(74) *Attorney, Agent, or Firm*—Baker & McKenzie LLP

(57) ABSTRACT

A semiconductor integrated circuit includes a DLL controlling block configured to enable or disable an update enable signal by detecting a change in a voltage level of a phase detecting signal during a predetermined time when an operation enable signal and a threshold phase difference detecting signal are enabled, and a delay locked loop (DLL) circuit configured to generate an output clock signal by delaying and driving the reference clock signal and to control a frequency of a change in the delay amount of the reference clock signal in response to the update enable signal.

11 Claims, 3 Drawing Sheets

SEMICONDUCTOR INTEGRATED CIRCUIT AND METHOD OF CONTROLLING THE SAME

CROSS-REFERENCES TO RELATED PATENT APPLICATION

The present application claims the benefit under 35 U.S.C 119(a) to Korean Application No. 10-2008-0078589, filed on Aug. 11, 2008, in the Korean Intellectual Property Office, which is incorporated herein by reference in its entirety as if set forth in full.

BACKGROUND

1. Technical Field

The embodiments described here relate to a semiconductor integrated circuit (IC) and a method of controlling the same and, more particularly, to semiconductor IC and a method of controlling the same including a delay locked loop (DLL) circuit.

2. Related Art

In general, a DLL circuit is commonly used to provide an internal clock signal that is led by a predetermined time interval in a phase more than a reference clock signal obtained by converting an external clock signal. The DLL circuit generates a phase difference between the internal clock signal used in a semiconductor IC and the external clock signal by delaying the internal clock signal due to a clock buffer and a transmission line, such that it can be used to solve a problem of long output data access time. The DLL circuit performs a function of controlling the phase of the internal clock signal to lead by predetermined time interval ahead of the external clock signal.

The DLL circuit includes a clock input buffer to buffer the external clock signal, thereby generating a reference clock signal. Then, the delay clock output through the delay line provides a delay value acquired by modeling delay amount by delay elements existing in a path transmitted up to a data output buffer to the delay clock signal to generate a feedback clock signal. The DLL circuit includes a phase detector to perform comparison and detecting a phase of the reference clock signal and the feedback clock signal, such that it generates a delay control signal to allow the delay line to control the delay amount provided to the reference clock signal to generate the delay clock signal. The phase detecting signal output from the phase detector includes information upon which phase of the reference clock signal and the feedback clock signal leads. According to the information, the delay line provides positive delay time or negative delay time to the reference clock signal.

However, in order to achieve a high speed operation of the semiconductor IC, the semiconductor IC tends to use higher frequency clock signals. Accordingly, the DLL circuit performs a delay fix operation for the high frequency clock signals. As a result, the reference clock signal and the feedback clock signal input to the phase detector within the DLL circuit become a high frequency clock signal, such that they have a very short period. In the DLL circuit using the high frequency clock signal, as described above, even when slight jitter components are included in the reference clock signal or the feedback clock signal when the phase detector compares and detects the phase, errors occur in the phase comparing and detecting results. In many instances, the clock signals generated inside the DLL circuit substantially include the jitter components. This can serve as a factor for degrading reliability of the phase comparison and detecting results. These errors degrade performance of the DLL circuit and increase a defect rate of a data output operation of the semiconductor IC including the DLL circuit.

SUMMARY

A semiconductor IC and a method of controlling the same capable of securing stability for jitter components of clock signals when using a DLL circuit operated with respect to high frequency clock signals are described herein.

In one aspect, a semiconductor integrated circuit includes a DLL controlling block configured to enable or disable an update enable signal by detecting a change in a voltage level of a phase detecting signal during a predetermined time when an operation enable signal and a threshold phase difference detecting signal are enabled; and a delay locked loop (DLL) circuit configured to generate an output clock signal by delaying and driving the reference clock signal and to control a frequency of a change in the delay amount of the reference clock signal in response to the update enable signal.

In another aspect, a semiconductor integrated circuit includes an operation controlling unit configured to generate a control clock signal in response to a reference clock signal, an operation enable signal, and a threshold phase difference detecting signal; a shifting unit configured to shift a phase detecting signal in response to the control clock signal; a phase state discriminating unit configured to generate a phase-up signal and a phase-down signal by combining latched signal in the shifting unit; an update calculating unit configured to generate an update enable signal in response to the operation enable signal, the phase-up signal, and the phase-down signal; and a delay controlling unit configured to control an operation of a delay line delaying the reference clock signal in response to the update enable signal and the phase detecting signal.

In another aspect, a method of controlling a semiconductor integrated circuit includes disabling a threshold phase difference detecting signal and enabling an update enable signal; controlling delay amount provided to a reference clock signal by a delay line according to an instruction of a phase detecting signal; enabling the threshold phase difference detecting signal when it is detected that a phase difference between the reference clock signal and a feedback clock signal is smaller than a threshold range; enabling or disabling the update enable signal by discriminating a frequency of a change in a level of the phase detecting signal; and controlling a delay amount provided to the reference clock signal by the delay line according to an instruction of the phase detecting signal in response to the update enable signal.

These and other features, aspects, and embodiments are described below in the section "Detailed Description."

DETAILED DESCRIPTION

Figure 1:
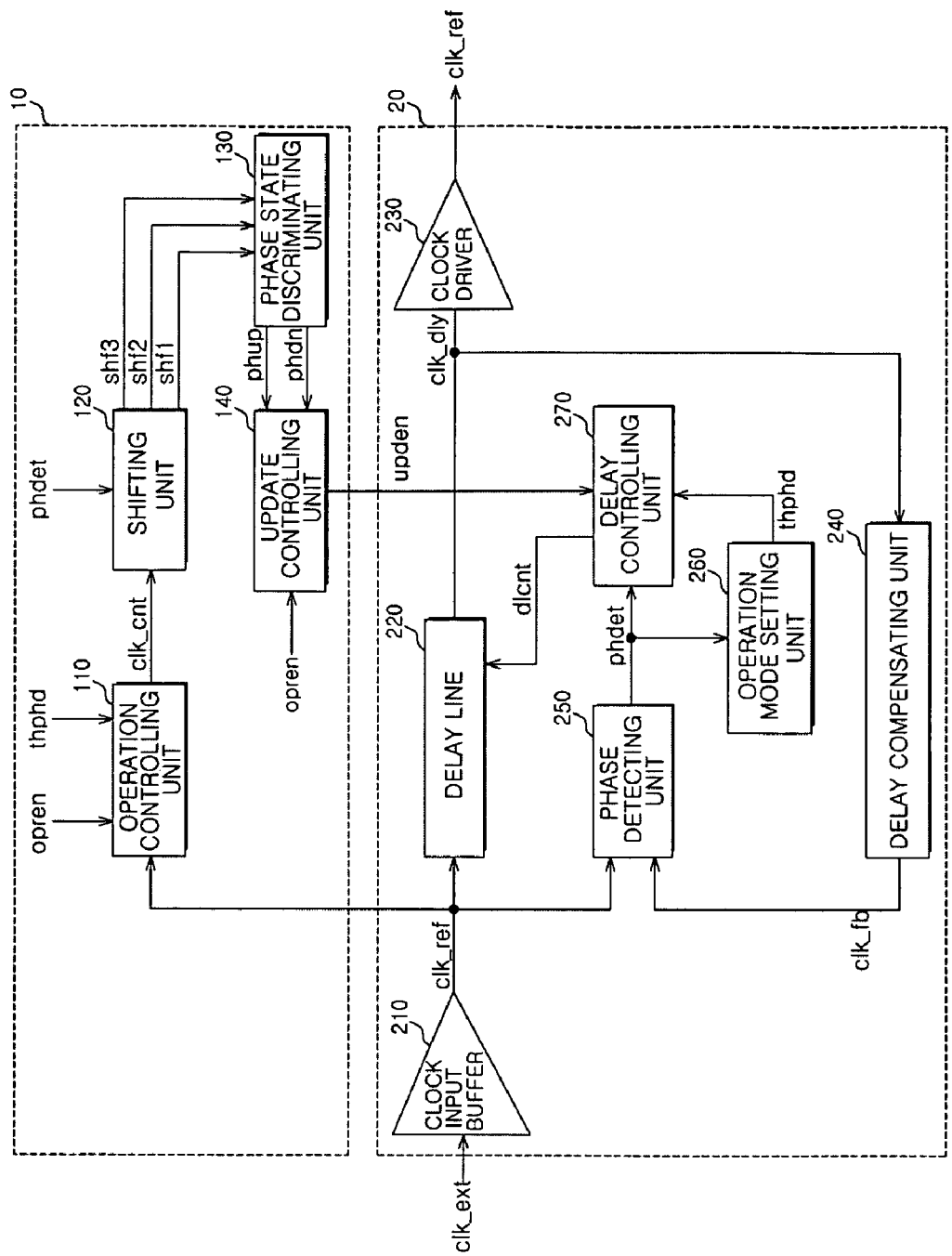
FIG. 1 is a schematic block diagram of an exemplary semiconductor integrated circuit according to one embodiment.

FIG. 1 is a schematic block diagram of an exemplary semiconductor integrated circuit according to one embodiment. In FIG. 1, a semiconductor integrated circuit can include a DLL controlling block 10 and a DLL circuit 20.

The DLL controlling block 10 can generate an update enable signal 'upden' in response to a reference clock signal 'clk_ref', an operation enable signal 'opren', a phase detecting signal 'phdet', and a threshold phase difference detecting signal 'thphd'. The DLL controlling block 10 can enable the update enable signal 'upden' when the operation enable signal 'opren' or the threshold phase difference detecting signal 'thphd' is disabled. Conversely, when the operation enable signal 'opren' and the threshold phase difference detecting signal 'thphd' are enabled, the DLL controlling block 10 can detect a change in a voltage level of the phase detecting signal 'phdet' during a predetermined time to disable or enable the update enable signal 'upden'.

The DLL controlling block 10 can be configured to include an operation controlling unit 110, a shifting unit 120, a phase state discriminating unit 130, and an update controlling unit 140.

The operation controlling unit 110 can generate a control clock signal 'clk_cnt' in response to the reference clock signal 'clk_ref', the operation enable signal 'opren', and a threshold phase difference detecting signal 'thphd'.

The shifting unit 120 can shift the phase detecting signal 'phdet' in response to the control clock signal 'clk_cnt' to generate first to third shifting signals 'shft1' to 'shf3'.

The phase state discriminating unit 130 can combine the first to third shifting signals 'shf1' to 'shf3' to generate a phase-up signal 'phup' and a phase-down signal 'phdn'.

The update controlling unit 140 can generate the update enable signal 'upden' in response to the operation enable signal 'opren', the phase-up signal 'phup', and the phase-down signal 'phdn'.

The DLL circuit 20, which can delay and drive the reference clock signal 'clk_ref' to generate an output clock signal 'clk_out', can control a frequency of a change in delay amount of the reference clock signal 'clk_ref' in response to the update enable signal 'upden'. When the update enable signal 'upden' is enabled, the DLL circuit 20 can be activated to delay and drive the reference clock signal 'clk_ref' to perform an operation of generating the output clock signal 'clk_out'. Similarly, when the update enable signal 'upden' is disabled, the DLL circuit 20 can lock a delay value provided to the reference clock signal 'clk_ref'.

The DLL circuit 20 includes a clock input buffer 210, a delay line 220, a clock driver 230, a delay compensating unit 240, a phase detecting unit 250, an operation mode setting unit 260, and a delay controlling unit 270.

The clock input buffer 210 can buffer an external clock signal 'clk_ext' to output the reference clock signal 'clk_ref'.

The delay line 220 can generate the delay clock signal 'clk_dly' by delaying the reference clock signal 'clk_ref' by a predetermined time in response to a delay control signal 'dl_cnt'.

The clock driver 230 can drive the delay clock signal 'clk_dly' to output the output clock signal 'clk_out'.

The delay compensating unit 240 can provide a delay value acquired by modeling amount delayed by delay elements existing in an output path of the delay clock signal 'clk_dly' to the delay clock signal 'clk_dly' to generate a feedback clock signal 'clk_fb'.

The phase detecting unit 250 can compare the phase of the reference clock signal 'clk_ref' with the phase of the feedback clock signal 'clk_fb' to generate the phase detecting signal 'phdet'.

The operation mode setting unit 260 can generate the threshold phase difference detecting signal 'thphd' in response to the phase detecting signal 'phdet'.

The delay controlling unit 270 can generate the delay control signal 'dl_cnt' in response to the update enable signal 'upden', the threshold phase difference detecting signal 'thphd', and the phase detecting signal 'phdet'.

The operation enable signal 'opren', which is a signal enabled to activate the DLL controlling block 10, can be implemented through a fuse option or a test mode. The threshold phase difference detecting signal 'thphd' is an enabled signal when a phase difference of the reference clock signal 'clk_ref' and the feedback clock signal 'clk_f' is smaller than a predetermined range the DLL circuit 20 can repetitively perform an operation to conform the phase of the reference clock signal 'clk_ref' to the phase of the feedback clock signal 'clk_fb'. Although the exemplary description includes an example where the threshold phase difference detecting signal 'thphd' can be generated from the operation mode setting unit 260, the threshold phase difference detecting signal 'thphd' can be generated by a circuit, such as a duty cycle compensating unit, included in the DLL circuit.

When both the operation enable signal 'opren' and the threshold phase difference detecting signal 'thphd' are enabled, the operation controlling unit 110 can drive the reference clock signal 'clk_ref' to generate the control clock signal 'clk_cnt'. When any one of the operation enable signal 'opren' and the threshold phase difference detecting signal 'thphd' is disabled, the operation controlling unit 110 can disable the control clock signal 'clt_cnt' at a low level. The operation controlling unit 110 can be configured to disable the control clock signal 'clk_cnt', thereby making it possible to prevent unnecessary current consumption in a period where the DLL controlling block 10 is not operated.

Then, the shifting unit 120 can perform an operation of shifting and latching the phase detecting signal 'phdet' in response to the control clock signal 'clk_cnt' by using a configuration in a shift register form. When the control clock signal 'clk_cnt' is disabled, the shifting unit 120 does not perform the shifting operation. Accordingly, all of the first to third shifting signals 'sht1' to 'shf3' can have low-level voltages that are an initial value. Conversely, when the control clock signal 'clk_cnt' is enabled and toggled, the shifting unit 120 can shift the phase detecting signal 'phdet' for each rising edge of the control clock signal 'clk_cnt'. Since the voltage level of the phase detecting signal 'phdet' can be a signal representing which phase of the reference clock signal 'clk_ref' and the feedback clock signal 'clk_fb' leads, the first to third shifting signals 'shf1' to 'shf3' can represent whether a voltage level of the phase detecting signal 'phdet' is changed within three periods of the control clock signal 'clk_cnt'.

The phase state discriminating unit 130 can combine the first to third shifting signals 'shf1' to 'shf3', and can enable the phase-up signal 'phup' when all of the first to third shifting signals 'shf1' to 'shf3' have high-level voltage, and can enable the phase-down signal 'phdn' when all of the first to third shifting signals 'shf1' to 'shf3' have high-level voltage. For example, enabling the phase-up signal 'phup' or the phase-down signal 'phdn' can indicate that the phase detecting signal 'phdet' maintains the same voltage level during a predetermined period.

The update controlling unit 140 can be activated when the operation enable signal 'opren' is enabled. Accordingly, the update controlling unit 140 can enable the update enable signal 'upden' when the phase-up signal 'phup' or the phase-down signal 'phdn' is enabled, and otherwise, can disable the update enable signal 'upden'. For example, the update controlling unit 140 can enable the update enable signal 'upden' only when the phase detecting signal 'phdet' maintains the voltage level during a predetermined period.

The delay controlling unit 270 can change a delay value provided to the reference clock signal 'clk_ref' by the delay line 220 in response to the phase detecting signal 'phdet' only when the update enable signal 'upden' is enabled.

In the semiconductor IC, the change in the voltage level of the phase detecting signal 'phdet' can be discriminated during the predetermined period, and the delay controlling unit 90 can be activated only when the phase detecting signal 'phdet' maintains the same voltage level. Thus, even when the phase or the pulse width is temporarily changed due to jitter component included in the reference clock signal 'clk_ref' or the feedback clock signal 'clk_fb', the semiconductor IC can insensitively responds to the change, making it possible to secure operation stability of the DLL circuit 20. In addition, when the operation of the DLL controlling block 10 is not needed, the clock controlling unit 100 can disable the control clock signal 'clk_cnt' such that unnecessary power consumption does not occur, making it possible to improve power efficiency.

Figure 2:
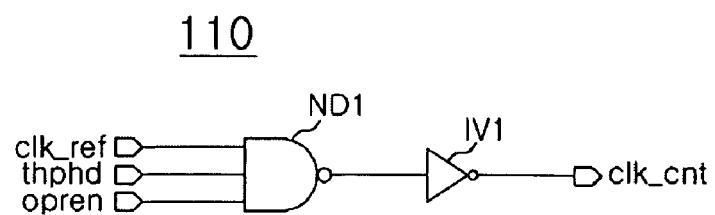
FIG. 2 is a schematic circuit diagram of an exemplary operation controlling unit capable of being implemented in the circuit of FIG. 1 according to one embodiment.

FIG. 2 is a schematic circuit diagram of an exemplary operation controlling unit capable of being implemented in the circuit of FIG. 1 according to one embodiment. In FIG. 2, an operation controlling unit 110 can include a first NAND gate ND1 and a first inverter IV1.

The first NAND gate ND1 can receive the reference clock signal 'clk_ref', the threshold phase difference detecting signal 'thphd', and the operation enable signal 'opren'. The first inverter IV1 can receive the output signal of the first NAND gate ND1 to output the control clock signal 'clk_cnt'.

Accordingly, the operation controlling unit 110 can drive the reference clock signal 'clk_ref' to generate the control clock signal 'clk_cnt' when the threshold phase difference detecting signal 'thphd' is enabled in a state where the operation enable signal 'opren' is enabled. Conversely, the operation controlling unit 110 can disable the control clock signal 'clk_cnt' at a low level when the operation enable signal 'opren' is disabled or the threshold phase difference detecting signal 'thphd' is disabled.

Figure 3:
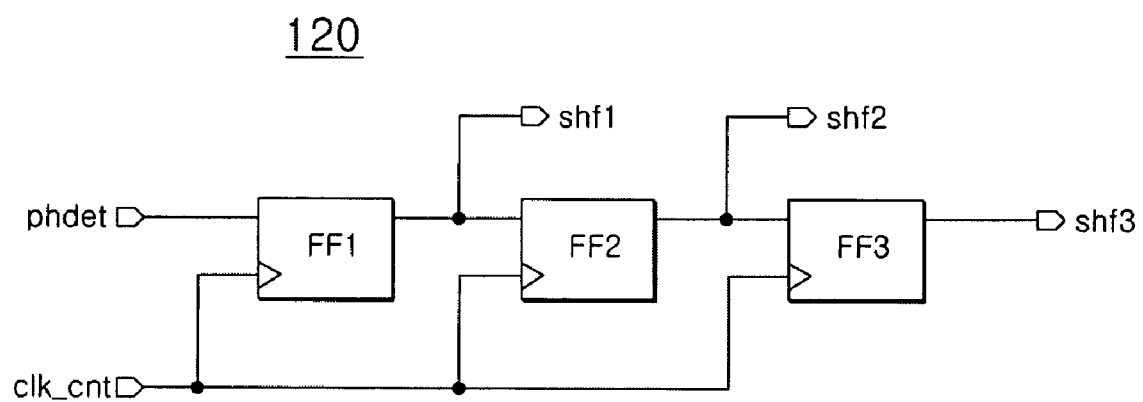
FIG. 3 is a schematic circuit diagram of an exemplary shifting unit capable of being implemented in the circuit of FIG. 1 according to one embodiment.

FIG. 3 is a schematic circuit diagram of an exemplary shifting unit capable of being implemented in the circuit of FIG. 1 according to one embodiment. In FIG. 3, the shifting unit 120 can include a first flip-flop FF1, a second flip-flop FF2, and a third flip-flop FF3.

The first flip-flop FF1 can latch the phase detecting signal 'phdet' in response to the control clock signal 'clk_cnt' to generate the first shifting signal 'shf1'. The second flip-flop FF2 can latch the first shifting signal 'shf1' in response to the control clock signal 'clk_cnt' to generate the second shifting signal 'shf2'. The third flip-flop FF3 can latch the second shifting signal 'shf2' in response to the control clock signal 'clk_cnt' to generate the third shifting signal 'shf3'.

Accordingly, the shifting unit 120 can store the voltage level of the phase detecting signal 'phdet' during three periods of the control clock signal 'clk_cnt' by the first to third shifting signals 'shf1' to 'shf3'. Conversely, when the control clock signal 'clk_cnt' is disabled, the shifting unit 120 can be non-activated, and thus, is not operated.

Figure 4:
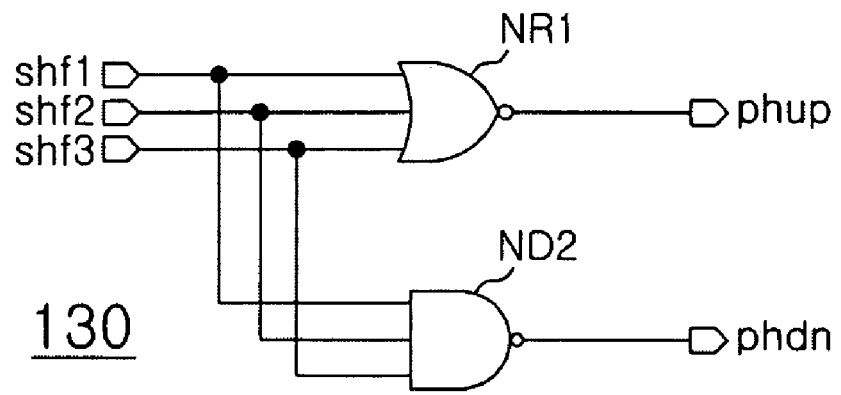
FIG. 4 is a schematic circuit diagram of an exemplary phase state discriminating unit capable of being implemented in the circuit of FIG. 1 according to one embodiment.

FIG. 4 is a schematic circuit diagram of an exemplary phase state discriminating unit capable of being implemented in the circuit of FIG. 1 according to one embodiment. In FIG. 4, a phase state discriminating unit 130 can include a first NOR gate NR1 and a second NAND gate ND2.

The first NOR gate NR1 can receive the first to third shifting signals 'shf1' to 'shf3' to output the phase-up signal 'phup'. The second NAND gate ND2 can receive the first to third shifting signals 'shf1' to 'shf3' to output the phase-down signal 'phdn'.

For purposes of example, the phase-down signal 'phdn' can be implemented as a low enable signal. Accordingly, the phase-up signal 'phup' can be enabled when all of the first to third shifting signals 'shf1' to 'shf3' are a low level, otherwise, are disabled. In addition, the phase-down signal 'phdn' can be enabled when all of the first to third shifting signals 'shf1' to 'shf3' are a high level, otherwise, are disabled.

Figure 5:
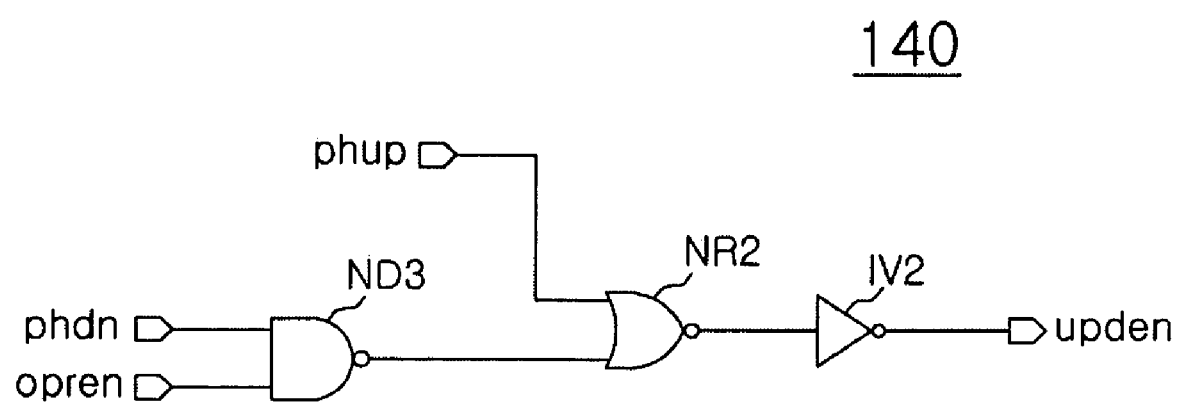
FIG. 5 is a schematic circuit diagram of an update controlling unit capable of being implemented in the circuit of FIG. 1 according to one embodiment.

FIG. 5 is a schematic circuit diagram of an update controlling unit capable of being implemented in the circuit of FIG. 1 according to one embodiment. In FIG. 5, an update controlling unit 140 can include a third NAND gate ND3, a second NOR gate NR2, and a second inverter IV2.

The third NAND gate ND3 can receive the phase-down signal 'phdn' and the operation enable signal 'opren'. The second NOR gate NR2 can receive the phase-up signal 'phup' and an output signal of the third NAND gate ND3. The second inverter IV2 can receive an output signal of the second NOR gate NR2 to output the update enable signal 'upden'.

Accordingly, the update enable signal 'upden' can be enabled when any one of the phase-up signal 'phup' and the phase-down signal 'phdn' is enabled in a state where the operation enable signal 'opren' is enabled. The update enable signal 'upden' can be enabled even when the operation enable signal 'opren' is disabled. Conversely, the update enable signal 'upden' can be disabled when both the phase-up signal 'phup' and the phase-down signal 'phdn' are disabled in a state where the operation enable signal 'opren' is enabled.

For example, in the DLL controlling block 10, when the operation enable signal 'opren' is disabled, the clock controller 110 does not generate the control clock signal 'clk_cnt', such that the shifting unit 120 and the phase state discriminating unit 130 can be non-activated, thereby reducing current consumption. Accordingly, the update controlling unit 140 can enable the update enable signal 'upden', and the delay controlling unit 270 in the DLL circuit 20 can perform a general operation of generating the delay control signal 'dlcnt' in response to the phase detecting signal 'phdet'.

However, if the operation enable signal 'opren' is enabled, the clock controlling unit 110 can be operated in response to the threshold phase difference detecting signal 'thphd' enabled according to whether the phase difference between the reference clock signal 'clk_ref' and the feedback clock signal 'clk_fb' are reduced to the threshold value or less. Accordingly, the clock controller 110 can disable the control clock signal 'clk_cnt' when the threshold phase difference detecting signal 'thphd' is disabled, thereby reducing the current consumption of the shifting unit 120 and the phase state discriminating unit 130. In addition, the update controlling unit 140 can enable the update enable signal 'upden' to support a general operation of the delay line 220.

In addition, the clock controlling unit 110 can enable the control clock signal 'clk_cnt' when the threshold phase difference detecting signal 'thphd' is enabled in the state where the operation enable signal 'opren' is enabled. Then, the update controlling unit 140 can determine whether the update enable signal 'upden' is enabled in response to the phase-up signal 'phup' and the phase-down signal 'phdn' generated by the shifting unit 120 and the phase state discriminating unit 130. Accordingly, the update controlling unit 140 can enable the update enable signal 'upden' when any one of the phase-up signal 'phup' or the phase-down signal 'phdn' is enabled. Thus, the voltage level of the phase detecting signal 'phdet' can maintain a stable state during a predetermined period without being fluctuated by influence of noise, such as clock jitter.

The semiconductor IC can discriminate whether the phase detecting signal maintains a stable state during the predetermined period when the update enable signal is enabled, and can activate the delay controlling unit only when the stability of the phase detecting signal is confirmed so as to support the normal operation of the DLL circuit. Accordingly, although the phase or the pulse width can be temporarily changed due to the jitter component included in the reference clock signal or the feedback clock signal, the stability of the DLL circuit can be secured. In addition, when the operation of the DLL controlling block is not needed, as in the case where the phase difference between the reference clock signal and the feedback clock signal is larger than the threshold value, the flow of current to some components of the DLL controlling block can be suppressed, making it possible to improve power efficiency.

While certain embodiments have been described above, it will be understood that the embodiments described are by way of example only. Accordingly, the device and method described herein should not be limited based on the described embodiments. Rather, the devices and methods described herein should only be limited in light of the claims that follow when taken in conjunction with the above description and accompanying drawings.

What is claimed is:

1. A semiconductor integrated circuit, comprising:
   a DLL controlling block configured to enable or disable an update enable signal by detecting a change in a voltage level of a phase detecting signal during a predetermined time when an operation enable signal and a threshold phase difference detecting signal are enabled; and
   a delay locked loop (DLL) circuit configured to generate an output clock signal by delaying and driving a reference clock signal to control a frequency of a change in the delay amount of the reference clock signal in response to the update enable signal and to lock a delay value provided to the reference clock signal in response to the disabled update enable signal.

2. The semiconductor integrated circuit of claim 1, wherein the DLL controlling block is configured to enable the update enable signal when the operation enable signal or the threshold phase difference detecting signal is disabled.

3. The semiconductor integrated circuit of claim 2, wherein the DLL controlling block includes:
   an operation controlling unit configured to generate a control clock signal in response to the reference clock signal, the operation enable signal, and the threshold phase difference detecting signal;
   a shifting unit configured to generate a plurality of shifting signals by shifting the phase detecting signal in response to the control clock signal;
   a phase state discriminating unit configured to generate a phase-up signal and a phase-down signal by combining the plurality of shifting signals; and
   an update controlling unit configured to generate the update enable signal in response to the operation enable signal, the phase-up signal, and the phase-down signal.

4. The semiconductor integrated circuit of claim 3, wherein the operation controlling unit is configured to generate the control clock signal by driving the reference clock signal when both the operation enable signal and the threshold phase difference detecting signal are enabled and to disable the control clock signal when one of the operation enable signal and the threshold phase difference detecting signal is disabled.

5. The semiconductor integrated circuit of claim 3, wherein the phase state discriminating unit is configured to enable the phase-up signal when all of the plurality of shifting signals have a first voltage level and to enable the phase-down signal when all of the plurality of shifting signals have a second voltage level.

6. The semiconductor integrated circuit of claim 3, wherein the update controlling unit is configured to enable the update enable signal in response to the enable one of the phase-up signal and the phase-down signal when the operation enable signal is enabled, and to enable the update enable signal regardless of the phase-up signal and the phase-down signal when the operation enable signal is disabled.

7. The semiconductor integrated circuit of claim 1, wherein the DLL circuit is configured to be activated when the update enable signal is enabled to perform an operation that delays and drives the reference clock signal to generate the output clock signal, and to lock a delay value provided to the reference clock signal when the update enable signal is disabled.

8. The semiconductor integrated circuit of claim 7, wherein the DLL circuit includes:
   a delay line configured to generate a delay clock signal by delaying the reference clock signal by a predetermined time in response to a delay control signal;
   a clock driver configured to output the output clock signal by driving the delay clock signal;
   a delay compensating unit configured to generate a feedback clock signal by providing a delay value acquired by modeling amount delayed by delay elements existing in an output path of the delay clock signal;
   a phase detecting unit configured to generate the phase detecting signal by comparing the phase of the reference clock signal with the phase of the feedback clock signal;
   an operation mode setting unit configured to generate the threshold phase difference detecting signal in response to the phase detecting signal; and
   a delay controlling unit configured to generate the delay control signal in response to the update enable signal, the threshold phase difference detecting signal, and the phase detecting signal.

9. The semiconductor integrated circuit of claim 8, wherein the delay controlling unit is configured to change a delay value provided to the reference clock signal by the delay line in response to the phase detecting signal when the update enable signal is enabled, and to lock a delay value provided to the reference clock signal by the delay line when the update enable signal is disabled.

10. The semiconductor integrated circuit of claim 8, wherein the threshold phase difference detecting signal is enabled when a phase difference between the reference clock signal and the feedback clock signal is smaller than a threshold range.

11. The semiconductor integrated circuit of claim 1, wherein the operation enable signal is a signal implemented by using a fuse option or a test mode.

* * * * *